United States Patent [19]
Piper et al.

[11] Patent Number: 5,984,734
[45] Date of Patent: *Nov. 16, 1999

[54] MODULAR INPUT/OUTPUT SYSTEM WITH FLEXIBLE INTERFACE WITH FIELD WIRING

[75] Inventors: Timothy R. Piper, Monroeville; Matthew Bernard Horne, Allison Park; R. T. Kissell, Sr., Natrona Heights; Daniel A. Hosko, Pittsburgh, all of Pa.

[73] Assignee: Westinghouse Process Control, Inc., Pittsburgh, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/846,943
[22] Filed: Apr. 30, 1997
[51] Int. Cl.⁶ ........................................ H01R 9/22
[52] U.S. Cl. ............................ 439/717; 439/715
[58] Field of Search .................... 439/701, 712, 439/715, 716, 717, 709, 953, 61

[56] References Cited

U.S. PATENT DOCUMENTS

| | | | |
|---|---|---|---|
| 4,574,068 | 3/1986 | Hill et al. | 376/259 |
| 4,716,722 | 1/1988 | Rambach | 439/717 |
| 5,388,995 | 2/1995 | Rudy et al. | 439/607 |
| 5,472,347 | 12/1995 | Nordenstrom et al. | 439/61 |
| 5,775,955 | 7/1998 | Graube et al. | 439/717 |

FOREIGN PATENT DOCUMENTS

| | | | |
|---|---|---|---|
| 0310965 | 9/1988 | European Pat. Off. | H01R 29/00 |
| 0489163A1 | 5/1991 | European Pat. Off. | H05K 1/11 |

*Primary Examiner*—Hien Vu
*Attorney, Agent, or Firm*—Marshall, O'Toole, Gerstein, Murray & Borun

[57] ABSTRACT

A modular input/output (I/O) unit utilizes plug-in personality modules to provide any one of a variety of interfaces between I/O signal processing cards mounted in plug-in electronics module and a bank of terminals providing connections for field wiring.

12 Claims, 6 Drawing Sheets

MODULAR INPUT/OUTPUT SYSTEM WITH FLEXIBLE INTERFACE WITH FIELD WIRING

Commonly owned, concurrently filed U.S. patent application Ser. No. 08/846,400 entitled: MODULAR INPUT/OUTPUT SYSTEM WITH REDUNDANCY AND TESTING.

Commonly owned, concurrently filed U.S. patent application Ser. No. 08/846,946 entitled: MODULAR I/O SYSTEM WITH TWO-WAY CONNECTORS BETWEEN UNITS AND A COMMON LOCK FOR MULTIPLE PLUG-IN MODULES.

BACKGROUND OF THE INVENTION

1. Field of the Invention

This invention relates to apparatus for interfacing field wiring with the input/output circuits of an electrical control or monitoring system. More particularly, it relates to a modular system in which the number of types of signal processing modules required for a particular input/output application are reduced by employing a personality module having a selection of configurations for interfacing the signal processing modules with the field wiring.

2. Background Information

Electronic control systems and monitoring systems such as process control systems require communication with the real world. This includes receiving inputs such as commands and process conditions provided by various sensors, transducers and/or contacts, and generating outputs such as control signals, status and results. This interaction is provided by input/output (I/O) hardware. The signals passed through the I/O can be analog and/or digital. Typically, the I/O includes signal processing circuitry which for example can limit the range of analog signals, provide filtering, amplification or attenuation, surge protection, isolation, pulse shaping for digital signals, and other signal conditioning. Different types of interfaces can be required for connecting the signal processing circuitry to various external devices connected to the I/O through field wiring. For instance, some current sensors require an external source of power. In some applications, a sensing resistor is required to convert a current signal to a voltage signal. In some applications, the field wiring requires local grounding while in other cases field grounding is provided.

Conventionally, this interfacing is provided as part of the I/O circuitry, typically on a plug-in I/O card. Although the signal conditioning applied may be identical for various types of field signals, separate I/O cards providing the different interfaces required must be used and inventoried.

Modular I/O units are being offered in which a selection of I/O cards each packaged in an electronic module can be plugged into a base which includes a backplane providing connections between circuits in the electronic module and terminals to which the field wiring is connected. The base units are mounted side-by-side on a standard DIN rail and plugged into one another for communication with a controller over a common bus system. A system of this type is shown in U.S. Pat. No. 5,472,347. While such an arrangement makes it easier to provide the necessary range of interfacing with the field wiring, it still requires the use and inventorying of many different types of electronic modules.

There is a need, therefore, for an improved I/O for connection with field wiring.

More particularly, there is a need for improved I/O for interfacing with field wiring which minimizes the number of configurations of signal processing cards required.

There is an additional need for such an I/O system which is modular for ease in adapting the system to a particular application.

SUMMARY OF THE INVENTION

These needs and others are satisfied by the invention which is directed to a modular input/output system which includes a base member, an electronics module providing predetermined signal processing plugged into the base member and terminal means on the base member for connection of field wiring. The base member includes a backplane having electrical conductors connected to the electronics module and the terminals. A personality module removably mounted in the base member has one of the plurality of configurations of interfaces which connects with the conductors on the backplane to provide a selected interface between the electronics module and the field wiring connected to the terminal means. The base member has a socket in which the personality module is removably supported and through which the personality module makes electrical connection with the electrical conductors on the backplane. In the preferred embodiment, the electronics module comprises a plurality of signal processing channels and the personality module has a plurality of interfacing means providing selected interfaces between the field wiring and the plurality of signal processing channels.

The backplane also has power inputs and the plurality of configurations of the interface means on the personality module includes circuit means connecting the power inputs to selected ones of the terminals. This configuration of the personality module can also include overcurrent protection devices such as fuses. This arrangement is useful for powering current transducers through the field wiring.

In addition, the backplane has ground connections and the personality modules can include ground circuit means connecting selected terminals to the ground connections. Other configurations of the personality module can include sensing resistors and circuits for connecting the sensing resistor across field wiring from a current sensor to convert the current signal to a voltage signal for input to the electronics module.

In the exemplary system, the electrical conductors on the backplane include a first set connecting a first set of terminals with the electronics module and also with the personality module. A second set of conductors on the backplane connects a second set of terminals only with the personality module and not with the electronics module. The personality module includes circuits which provide the desired interface and make the appropriate connections to the conductors connected to the electronics module.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
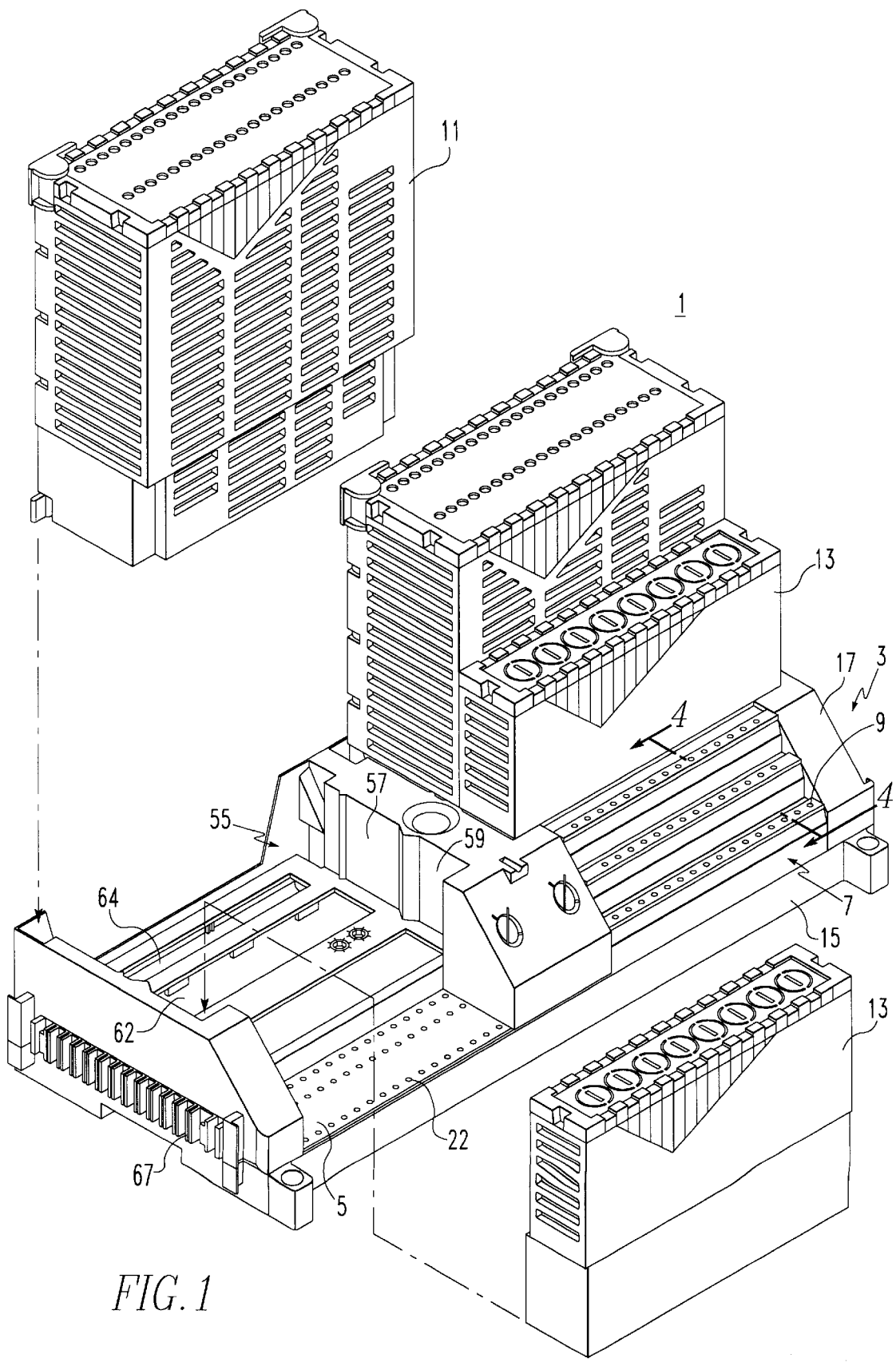
FIG. 1 is a partially exploded isometric view of a modular I/O unit in accordance with the invention.
Figure 1A:
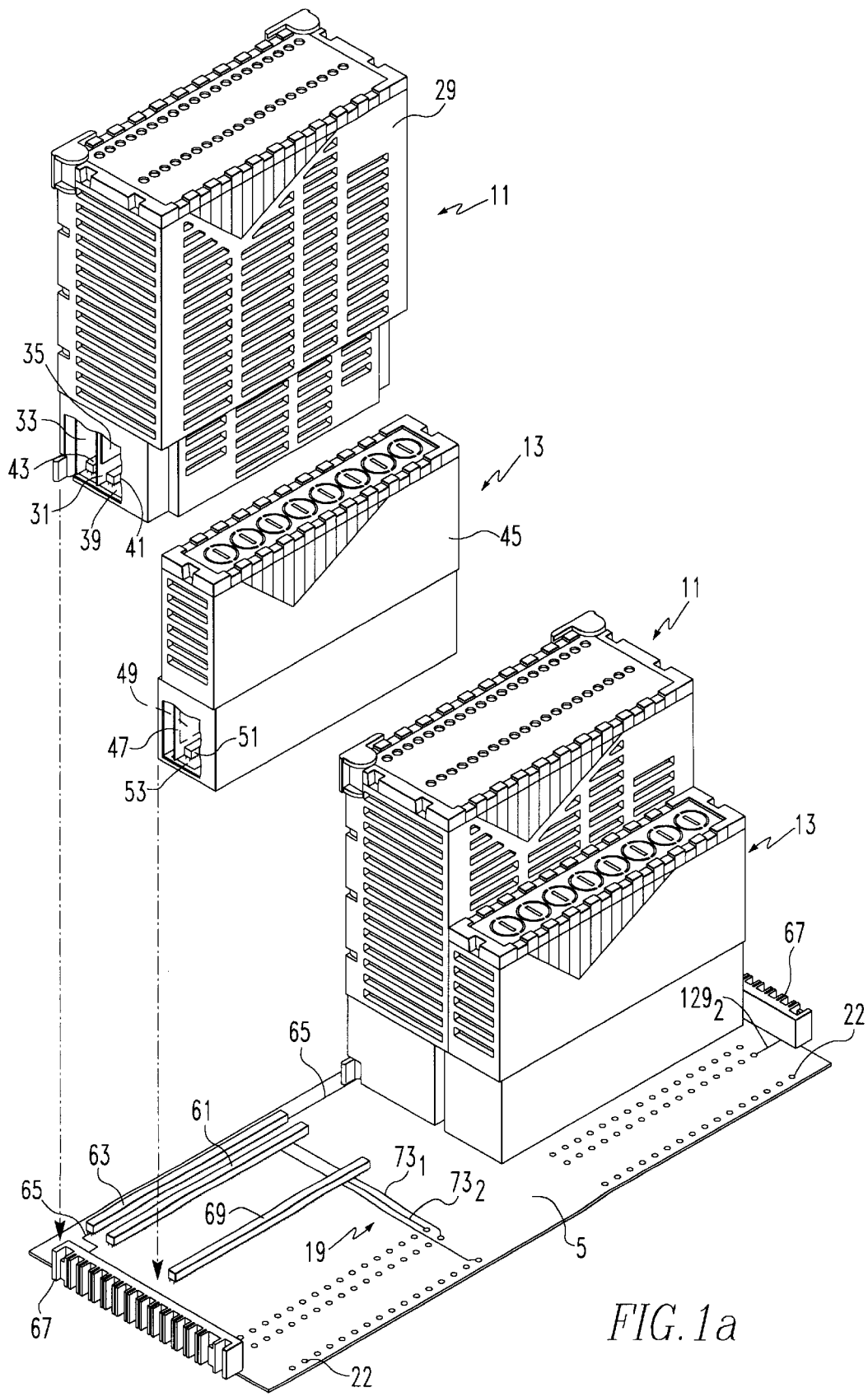
FIG. 1a is a partially exploded isometric view showing the interconnection of electronics modules with a backplane within the modular I/O unit.

Referring to FIGS. 1, 1a, 2 and 3, the modular input/output (I/O) system 1 of the invention includes as its basic components a base member 3 in which a backplane 5 and a bank 7 of electrical terminals 9 are permanently mounted, and a pair of interchangeable electronics modules 11 and personality modules 13. Base member 3 includes a base 15 and top 17 between which the backplane 5 is clamped. The backplane 5 has a pattern 19 of electrical conductors, to be described in more detail below, which selectively connect terminals 9 to the electronics module 11 and personality module 13. In the system shown, the housing 3 (also referenced as base number 3) supports dual arrangements of terminals 9, electronics module 11 and personality modules 13. It will be understood that other arrangements could include a housing mounting a single set including a bank of terminals 9, an electronics module and a personality module, or three or more sets of these components.

Figure 4:
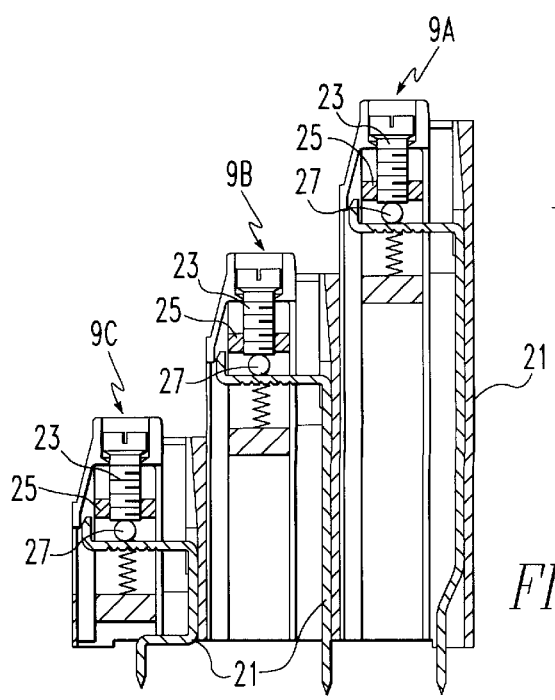
FIG. 4 is a sectional view through the terminals which form part of the modular I/O unit taken along the line 4—4 in FIG. 1.

The terminals 9 of each bank of terminals 7, are conveniently arranged in three tiers which can be labeled A, B and C. As shown in the cross-section of FIG. 4, each of the terminals 9 includes a contact 21 which extends downward and terminates in a pointed end which engages holes 22 in the backplane 5 where it is connected to the circuitry 19. Terminals screws 23 engaged in clamps 25 secure the contacts 21 to field wiring 27.

Figure 2:
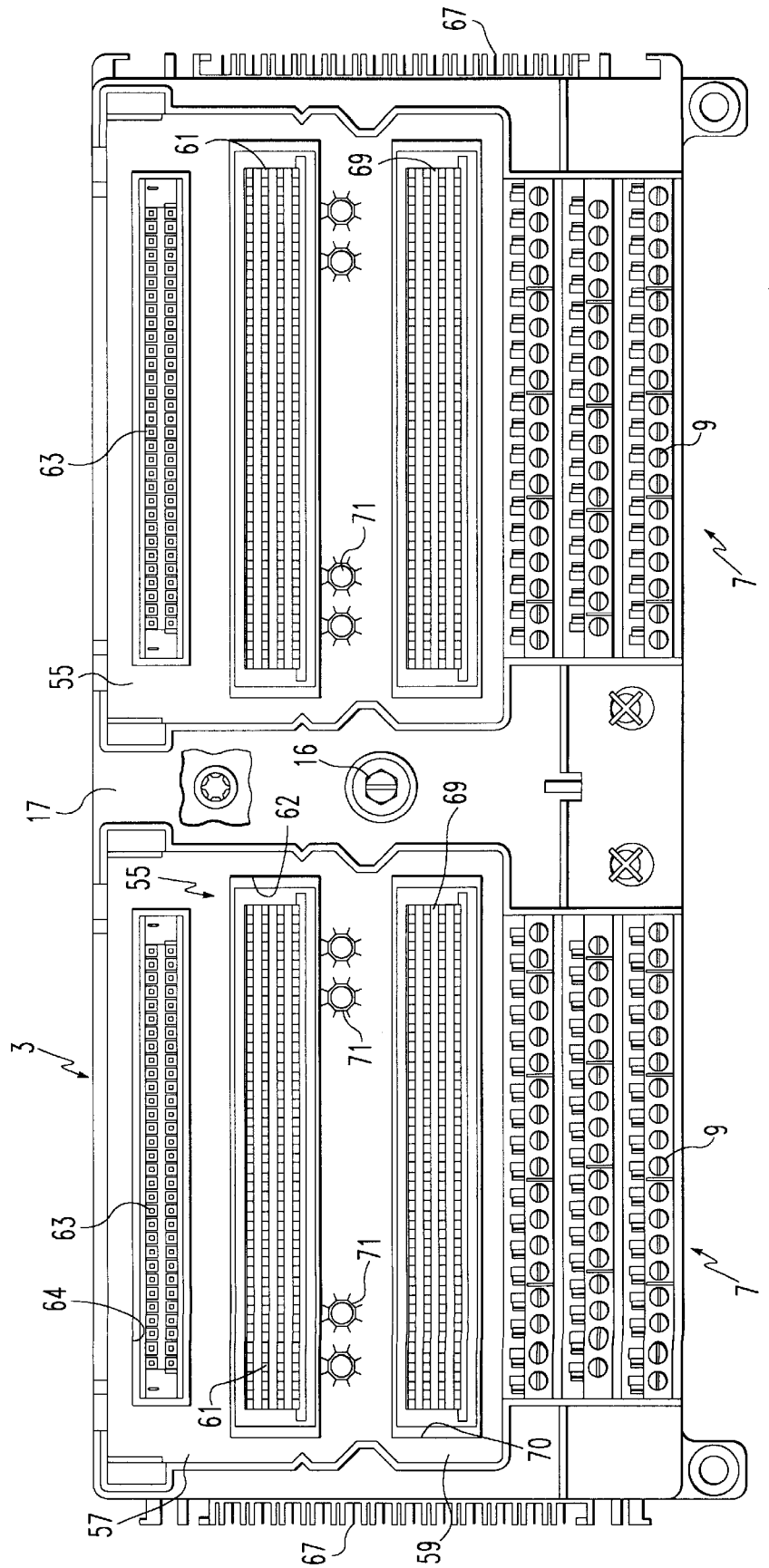
FIG. 2 is a top view of the housing of the modular I/O unit of FIG. 1 with the electronics and personality modules removed.
Figure 3:
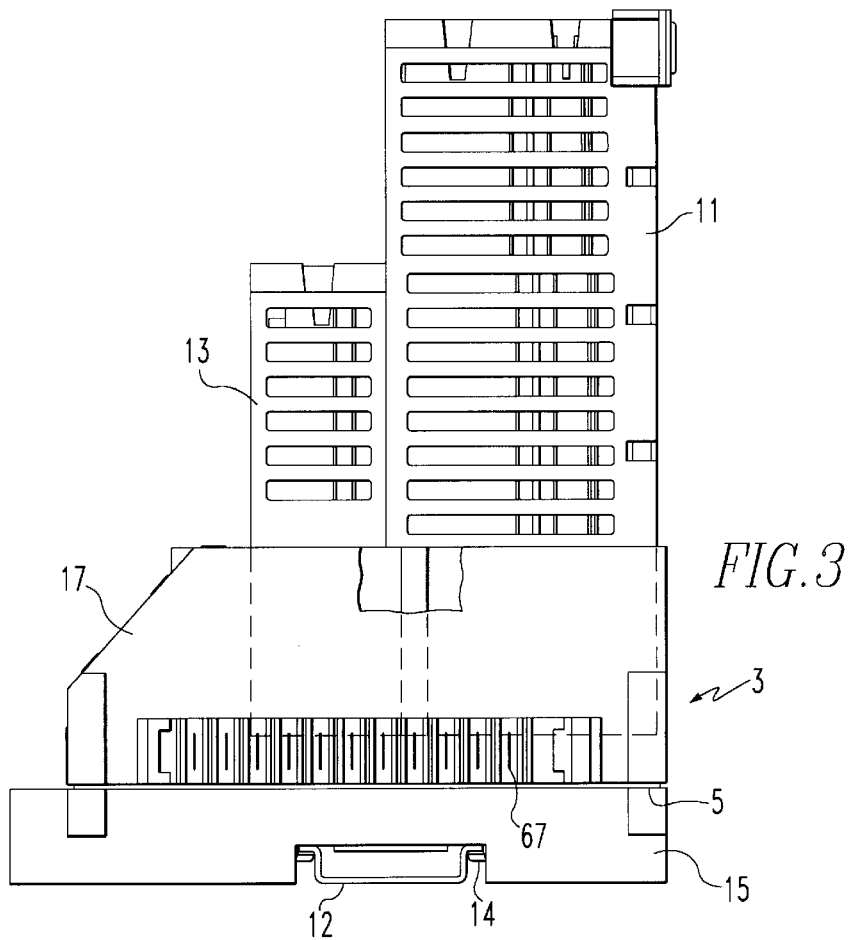
FIG. 3 is a side view of the I/O modular unit of FIG. 1 shown assembled.

Returning to FIGS. 1, 1a, 2 and 3, the electronics module 11 includes a housing 29 in which are mounted a pair of circuit cards 31 and 33. The circuit card 31 contains the I/O signal processing circuitry 35. Depending upon the particular application, signal processing circuitry 35 performs one or more functions which can include filtering, amplification or attenuation, surge protection, isolation, range limiting or scaling, and pulse shaping, or other signal conditioning. The second card 33 in the electronics module housing 29 is the communications card through which signals are transmitted between the signal conditioning circuitry 35 and the processing system for which the I/O is provided. The base 3 is secured to a mounting rail 12 such as a standard DIN rail by a clamp 14, as seen in FIG. 3. This clamp is actuated by a screw 16 accessible through the top member 17 of the base, as shown in FIG. 2. Mounted on the signal processing card 31 and the communications card 33 adjacent an opening 39 in the bottom in the housing 29 are electrical connectors 41 and 43, respectively.

The personality module 13 includes a housing 45 containing a circuit card 47 having interface circuitry 49, which as will be seen, can have a plurality of configurations. An electrical connector 51 is provided on the bottom edge of the circuit card 47 adjacent an opening 53 in the housing 45.

Each side of the top 17 of the housing 3 has a recess 55 which forms side-by-side sockets 57 and 59 for plug in of an electronics module 11 and a personality module 13, respectively. Mounted on the backplane 5 in alignment with the socket 57 are electrical connectors 61 and 63 accessible through openings 62 and 64 respectively in the top 17 of the base member 3. These connectors 61 and 63 mate with the connectors 41 and 43 in the electronics module. The connector 61 electrically connects the signal processing card 31 with the I/O circuits 19 on the backplane while the connector 63 connects the communications circuitry on the communications card 33 with communication busses (e.g. a plurality of channels) indicated at 65 on the backplane. Connectors 67 on each end of the backplane connect the communication busses 65 with adjacent I/O units 1 or a controller in a manner to be discussed. The connectors 67 and communications bus 65 provide power to the electronics module 11 in addition to routing signals to and from the modules.

In a similar manner, the connector 51 on the circuit card 47 of the personality module 13 mates with a connector 69 on the backplane 5, accessible through opening 70 in the top 17, to connect the interface circuitry 49 with the circuits 19 as the personality module 13 is plugged into the socket 59. Preferably, octagonal keys 71 on the backplane 5 assure that only an electronics module of a given type having a matching key (not shown) can be plugged into the socket 57.

Figure 5:
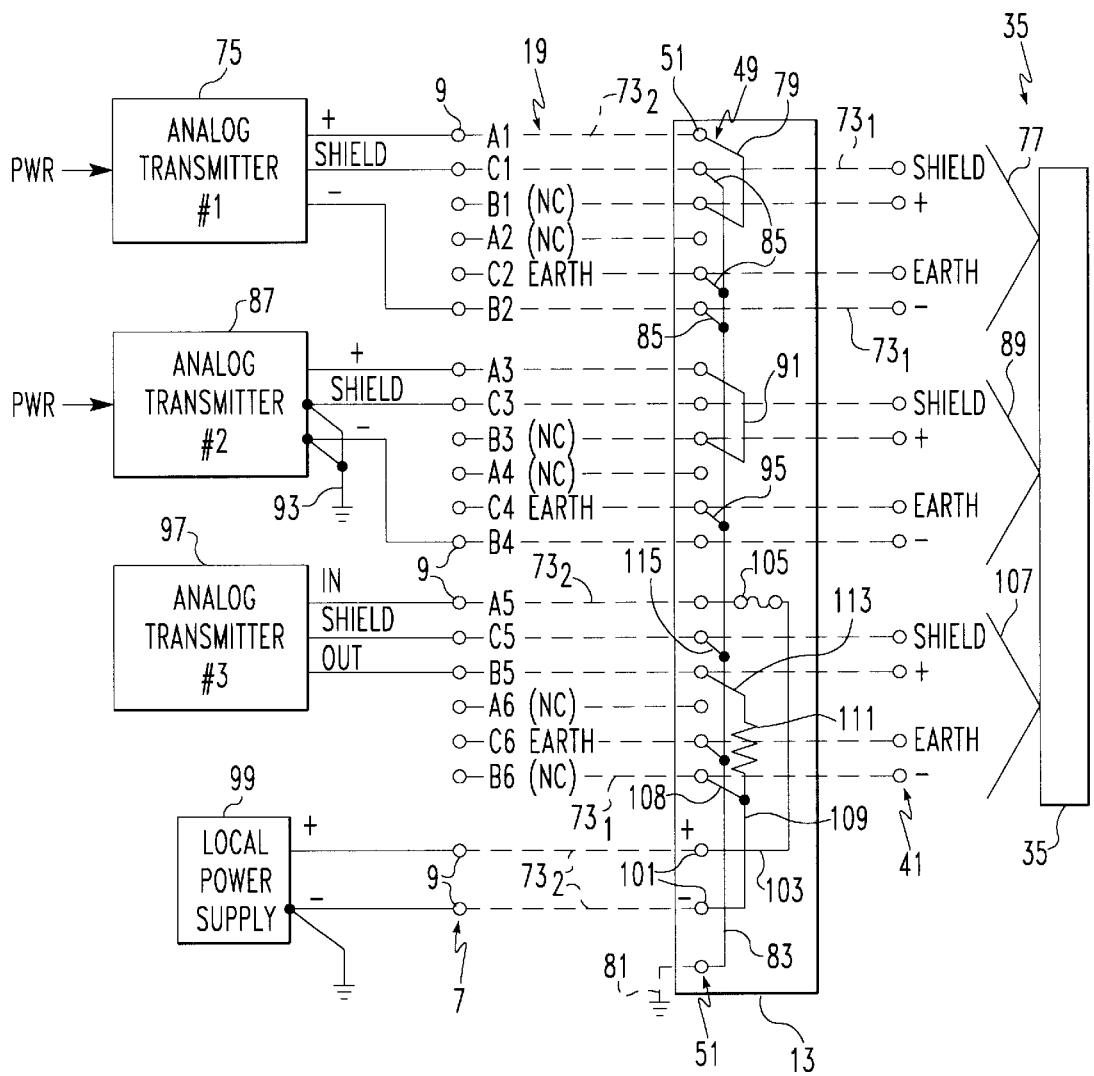
FIG. 5 is a schematic circuit diagram illustrating one of the plurality of interface configurations possible in accordance with the invention.

FIG. 5 is a schematic circuit diagram for the modular I/O unit 1 where the personality module 13 has an exemplary one of the plurality of interface configurations. In this diagram the dash lines are conductors 73 of the circuitry 19 on the backplane 5. As can be seen, there are two sets of the backplane conductors 73. The first set $73_1$ connect each of the terminals 9 with connections in the connector 51 of the personality module 13 and the connector 41 of the electronics module 11. The second set of conductors $73_2$ on the backplane 5 extend between terminals 9 and connections on the connector 51 of the personality module 13 only. They do not make any connection with the connector 41 on the electronics module 11.

In the example given, a first analog transmitter 75 which is self powered or externally powered has "+","−" and "shield" outputs connected to terminals 9 in the bank of terminals 7. As can be seen from FIG. 5, the "−" field wire from the transmitter 75 is connected to a lead $73_1$ of the first set which is connected to both the personality module and a "−" connection on the connector 41 for a first channel 77 of the signal conditioning circuit 35. The "+" lead of the transmitter 75 is connected to a conductor $73_2$ which only extends to the personality module 13. However, a jumper 79 in the interface circuitry 49 of the personality module 13 connects the "+" transmitter lead to a lead of the second set $73_2$ connected to a "+" connection on the connector 41 of the first channel 77 on the electronics module. The "shield" lead on the transmitter 75 is connected to a conductor of the first type $73_1$ on the backplane which in turn connects it to a "shield" connection in the electronics module.

The backplane 5 also has a ground connection 81 which connects to a ground lead 83 in the personality module circuitry. This ground is used for local grounding of the signal from the analog transmitter 75 by jumpers 85 in the particular interface circuitry 49 of the personality module.

A second self or remotely powered analog voltage transmitter 87 is similarly connected to a second channel 89 of the signal processing circuit 35 on the electronics module through use of the jumper 91. However, the analog transmitter 87 is field grounded at 93. Thus, the ground jumper 95 is used in this channel of the personality module only to connect the "earth" input on the electronics module to the ground lead 83.

The analog transmitter 97 is a current sensor which requires a power source. A local power source 99 is connected to a pair of terminals 9 in the terminal bank which are connected to terminals 101 on the connector 51 in the personality module through backplane conductors of the second set $73_2$. The "+" side of the local power supply 99 is connected by a lead 103 on the interface circuitry 49 of the personality module to another backplane lead of the second set $73_2$ which connects through a terminal 9 to the "in" terminal of analog transmitter 97. A current limiting device such as the fuse 105 can be provided in the lead 103 by the personality module. The "out" terminal of the transmitter 97 is connected through a backplane lead of the first type $73_1$ to the personality module and the "+" connection of a third channel 107 of the signal processing circuitry 35 on the electronics module. The "−" terminal of the third channel 107 is connected by a lead $73_1$ of the first set to the personality module where it is connected by a jumper 108 and lead 109 to the grounded side of the local power supply 99. A sensing resistor 111 is provided on the personality module in the lead 109 to convert the current signal to a voltage signal. This sensing resistor 111 is connected from the "out" terminal of transmitter 97 to the "−" side of the local power supply 99 through leads 109 and 113 on the personality module. The voltage signal is sensed by the third channel 107 of the electronics module through the two previously-described backplane leads $73_1$. The "shield" terminal on the transmitter 97 is connected through a backplane lead of the $73_1$ set to the "shield" connection for the channel 107 in the electronics module. This shielding is grounded by the jumper 115 in the personality module.

FIG. 5 illustrates a particular interface configuration which the personality module 13 can provide for the electronics module 11. The exemplary electronics module 11 is a voltage analog input electronics module. Other interfaces can be provided for this particular electronics module by other configurations of the interface circuitry 49 on the personality module. Furthermore, other types of electronics modules can be provided with personality modules having interface circuitry adapted for the particular application.

As can be seen from FIGS. 2 and 3, the modular I/O unit 1 has a clamp 14 mounted in the base 15 of the housing 3 which engages in a standard DIN rail 12 for mounting the unit 1. The clamp 14 is operated through rotation of a fastener 16 accessible through the top 17 of the base 3. This clamp 14 also provides the ground connection 81 for the personality module.

Figure 6:
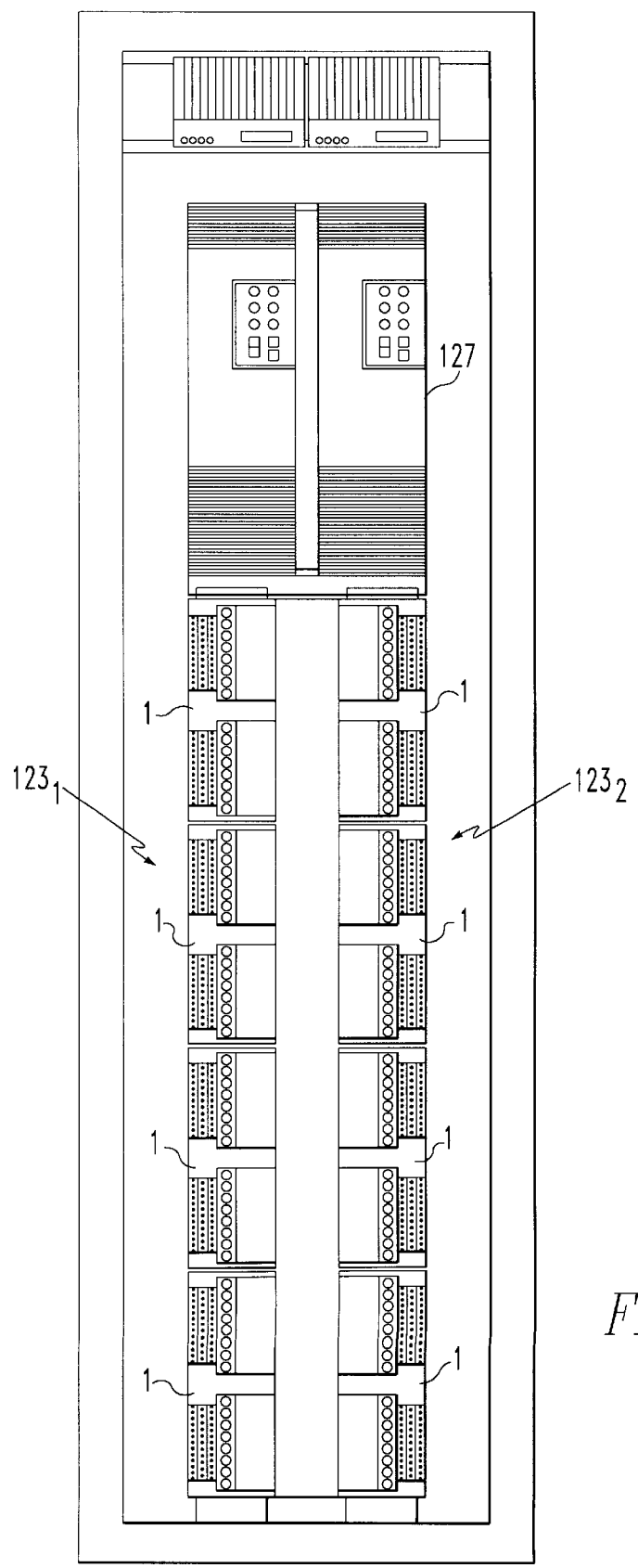
FIG. 6 is a front elevation view of a process control system incorporating a controller and a number of modular I/O units in accordance with the invention.

As shown in FIG. 6, the modular I/O units 1 may be arranged in branches $123_1$ and $123_2$ which are connected to a controller such as the single/redundant controller 127. The communication busses 65 on adjacent modular I/O units 1 are interconnected by the connectors 67 to connect each of the modules to the controller 127.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A modular I/O unit for field wiring, comprising:

a base member;

a backplane mounted in said base member;

an electronics module including a signal processing circuit mounted on said base member via a first circuit connector disposed on said base member;

a plurality of terminals mounted on said base member wherein each of the plurality of terminals includes a contact adapted to make an electric connection with the field wiring;

a personality module removably mounted on a second circuit connector disposed on said base member;

an interface circuit housed in said personality module;

a first plurality of electrical conductors disposed on said backplane extending between said terminals and the second circuit connector; and a second plurality of electrical conductors disposed on said backplane extending between the second circuit connector and the first circuit connector;

wherein the first and second plurality of electrical conductors and the first and second circuit connectors provide electrical connections between said terminals, the personality module, and said electronics module, wherein said interface circuit of said personality module provides an interface between said electronics module and said field wiring connected to said plurality of terminals to change a property of the electrical connection between said electronics module and said field wiring.

2. The modular I/O unit of claim 1 wherein said base member has a socket in which said personality module is removably supported in said base member and through which said personality module makes electrical connection with said electrical conductors.

3. The modular I/O unit of claim 1 wherein said electronics module comprises a plurality of signal processing channels, and provides selected interfaces between said field wiring and said plurality of signal processing channels.

4. The modular I/O unit of claim 1 wherein said personality module has power inputs, and said interface circuit of said personality module includes a connector for connecting said power inputs to selected terminals of said plurality of terminals.

5. The modular I/O unit of claim 4 wherein said personality module includes an overcurrent protection device connected between said power inputs and said selected terminal.

6. The modular I/O unit of claim 4 wherein said power inputs are connected by leads on said backplane to receive power through specified terminals of said plurality of terminals.

7. The modular I/O unit of claim 1 wherein said backplane has a ground connection and said interface circuit includes a ground circuit connecting specified terminals of said plurality of terminals to said ground connection.

8. The modular I/O unit of claim 1 wherein said interface circuit includes a sensing resistor, and wherein said sensing resistor is connected across said electrical conductors on said backplane.

9. The modular I/O unit of claim 1 wherein a first pair of said first and second electrical conductors are connected together to connect a first terminal of said plurality of terminals with said electronics module and also with said personality module.

10. The modular I/O unit of claim 9 wherein said personality module includes power inputs and said interface circuit connects said power inputs with certain of the terminals of said second set of terminals.

11. A modular I/O system for field wiring comprising:

a controller;

a plurality of modular I/O units each comprising:

a base member;

backplane mounted in said base member;

an electronics module including a signal processing circuit mounted on said base member via a first circuit connector disposed on said base member;

a plurality of terminals mounted on said base member wherein each of the plurality of terminals includes a contact adapted to make an electrical connection with the field wiring;

a personality module removably mounted on a second circuit connector disposed on said base member;

an interface circuit housed in said personality module;

a first plurality of electrical conductors disposed on said backplane extending between said terminals and the second circuit connector;

a second plurality of electrical conductors disposed on said backplane extending between the second circuit connector and the first circuit connector;

wherein the first and second plurality of electrical conductors and the first and second circuit connectors provide electrical connections between said terminals, the personality module, and said electronics module, wherein said interface circuit of said personality module provides an interface between said electronics module and said field wiring connected to said plurality of terminals to change a property of the electrical connection between said electronics module and said field wiring; and an electrical connection that electrically connects said plurality of modular I/O units to said controller.

12. The modular I/O system of claim 11 wherein multiple combinations of terminals, electronics module, personality module and electrical conductors on said backplane are provided in said plurality of modular I/O units in said base member.

* * * * *

UNITED STATES PATENT AND TRADEMARK OFFICE
CERTIFICATE OF CORRECTION

PATENT NO. : 5,984,734
DATED : November 16, 1999
INVENTOR(S) : Piper, et. al.

It is certified that error appears in the above-identified patent and that said Letters Patent is hereby corrected as shown below:

In Claim 1, at Column 6, Line 3, "electric" should be "electrical";

Signed and Sealed this

Twenty-fifth Day of July, 2000

Attest:

Q. TODD DICKINSON

Attesting Officer

Director of Patents and Trademarks